(12) United States Patent
Mun et al.

(10) Patent No.: US 11,557,620 B2
(45) Date of Patent: Jan. 17, 2023

(54) METAL GRID STRUCTURE INTEGRATED WITH DEEP TRENCH ISOLATION STRUCTURE

(71) Applicant: OMNIVISION TECHNOLOGIES, INC., Santa Clara, CA (US)

(72) Inventors: Seong Yeol Mun, Santa Clara, CA (US); Yibo Zhu, Sunnyvale, CA (US); Keiji Mabuchi, Los Altos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 90 days.

(21) Appl. No.: 17/217,937

(22) Filed: Mar. 30, 2021

(65) Prior Publication Data

US 2022/0320163 A1   Oct. 6, 2022

(51) Int. Cl.
 *H01L 27/146* (2006.01)

(52) U.S. Cl.
 CPC .... *H01L 27/14623* (2013.01); *H01L 27/1463* (2013.01); *H01L 27/14685* (2013.01); *H01L 27/14621* (2013.01); *H01L 27/14627* (2013.01)

(58) Field of Classification Search
 CPC ........... H01L 27/1463; H01L 27/14623; H01L 27/14685; H01L 27/14621; H01L 27/14627
 See application file for complete search history.

(56) References Cited

U.S. PATENT DOCUMENTS

| | | | |
|---|---|---|---|
| 2018/0040661 A1 | 2/2018 | Lee et al. | |
| 2018/0301490 A1* | 10/2018 | Dofuku | H01L 27/1464 |
| 2020/0135798 A1 | 4/2020 | Tsao et al. | |
| 2022/0231058 A1* | 7/2022 | Kao | H01L 27/14623 |

* cited by examiner

*Primary Examiner* — Nelson Garces

(74) *Attorney, Agent, or Firm* — Perkins Coie LLP

(57) ABSTRACT

A high k passivation layer, an anti-reflective coating layer, and a buffer layer are disposed over semiconductor substrate including photodiodes formed therein. Trenches are etched into the semiconductor substrate through the buffer layer, anti-reflective coating layer, and the high k passivation layer in a grid-like pattern surrounding each of the photodiodes in the semiconductor substrate. Another high k passivation layer lines an interior of the trenches in the semiconductor substrate. An adhesive and barrier layer is deposited over the high k passivation layer that lines the interior of the trenches. A deep trench isolation (DTI) structure is formed with conductive material deposited into the trenches over the adhesive and barrier layer to fill the trenches. A grid structure is formed over the DTI structure and above a plane of the buffer layer. The grid structure is formed with the conductive material.

31 Claims, 8 Drawing Sheets

METAL GRID STRUCTURE INTEGRATED WITH DEEP TRENCH ISOLATION STRUCTURE

BACKGROUND INFORMATION

Field of the Disclosure

This disclosure relates generally to image sensors, and in particular but not exclusively, relates to image sensors with pixels that are isolated with a metal grid structure integrated with a deep trench isolation structure.

Background

Image sensors have become ubiquitous and are now widely used in digital cameras, cellular phones, security cameras as well as in medical, automotive, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which are read out as analog signals from the column bitlines and converted to digital values to produce digital images (i.e., image data) that represent the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
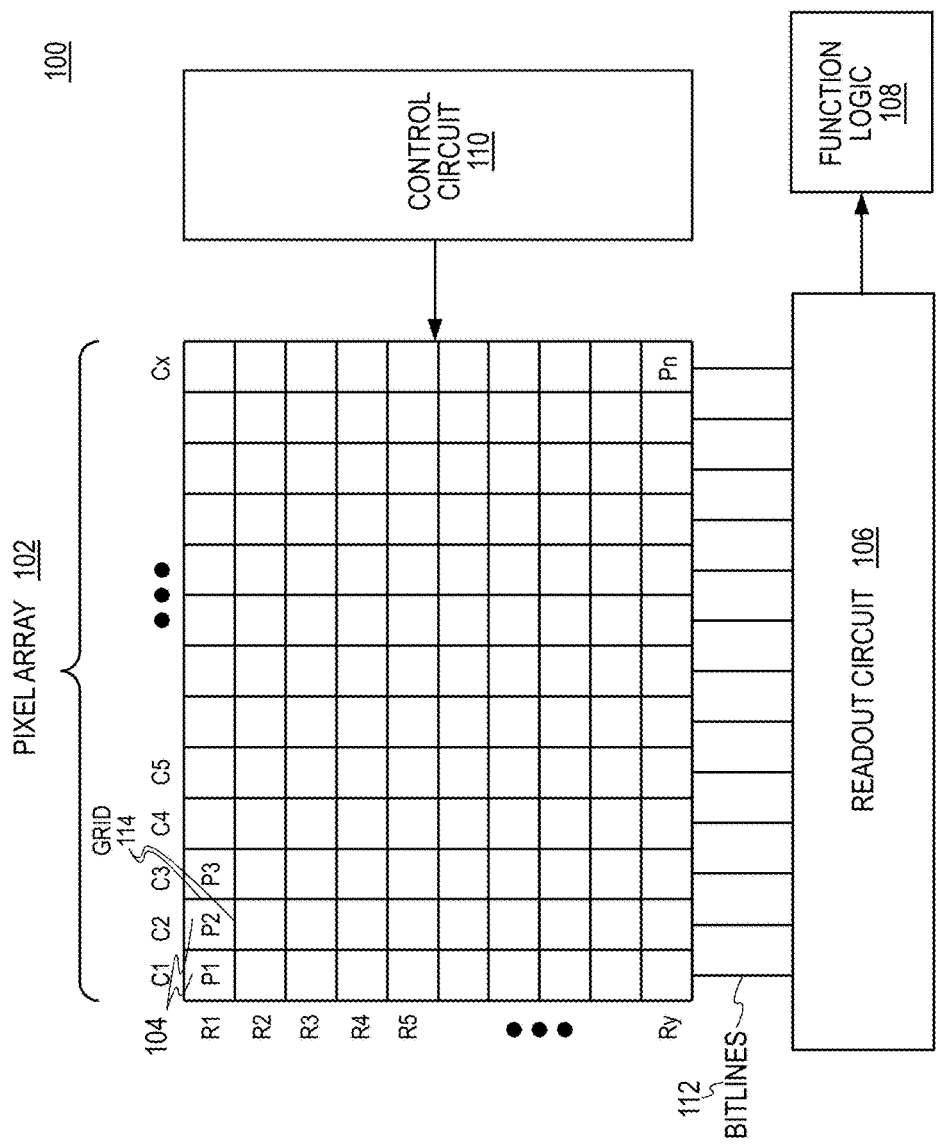
FIG. 1 illustrates one example of an imaging system including a pixel array with a metal grid structure integrated with a deep trench isolation structure in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system including various examples of a pixel array with a metal grid structure integrated with a deep trench isolation structure and a method for fabricating the same are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including various examples of a pixel array with a metal grid structure integrated with a deep trench isolation structure and a method for fabricating the same are described. In various examples, a metal grid structure is integrated with a deep trench isolation structure that is formed in a semiconductor substrate with a high k passivation layer, an anti-reflective coating layer, and a buffer layer disposed over the semiconductor substrate. As will be shown in the various examples, the high k passivation layer, anti-reflective coating layer, and buffer layer are deposited over the semiconductor substrate prior to the etching of the trenches in semiconductor substrate in which a deep trench isolation structure is formed. As a result, the critical dimensions of the trenches that are etched into the semiconductor material are larger compared to trenches that are etched before the deposition of the high k passivation layer, anti-reflective coating layer, and buffer layer over the semiconductor substrate. The larger critical dimensions of the trenches help to avoid potential choking issues that can occur at the top portions of the trenches due to anti-reflective material deposition. In various examples, the conductive material may also be deposited with multiple deposition steps, which enables improved etch control in accordance with the teachings of the present invention.

To illustrate, FIG. 1 shows one example of an imaging system 100 including a pixel array with a metal grid structure integrated with a deep trench isolation structure in accordance with the teachings of the present invention. As will be discussed, in the various examples, a high k passivation layer, an anti-reflective coating layer, and a buffer layer are deposited over the semiconductor substrate prior to the etching of trenches in semiconductor substrate in which a deep trench isolation structure is formed in accordance with the teachings of the present invention. As shown in the illustrated example, imaging system 100 includes a pixel array 102, a control circuit 110, a readout circuit 106, and function logic 108. In one example, pixel array 102 is a two-dimensional (2D) array including a plurality of pixels 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

As will discussed in greater detail below, in various examples, the pixels 104 are separated or isolated from one another with a grid structure 114 that is formed over a deep trench isolation (DTI) structure that provides isolation between adjacent pixels 104 within the semiconductor substrate in the pixel array 102 in accordance with the teachings of the present invention.

In various examples, the each pixel 104 may include one or more photodiodes configured to photogenerate image charge in response to incident light. The image charge generated in each photodiode in pixel 104 is transferred to a respective floating diffusion in each pixel 104, which is converted to an image signal and then read out from each pixel 104 by readout circuit 106 through column bit lines 112. In the various examples, the image charge from each row of pixels 104 may be read out in parallel through column bit lines 112 by readout circuit 106.

In the various examples, the analog image charge signals may be converted to digital values with an analog to digital converter (ADC) included in the readout circuit 106. In various examples, readout circuit 106 may also include amplification circuitry, or otherwise. The digital representations of the image charge values may then be transferred to function logic 108.

Function logic 108 may simply store the image charge values or even manipulate the image data by applying post image effects (e.g., crop, rotate, remove red eye, adjust brightness, adjust contrast, or otherwise). In one example, readout circuit 106 may read out one row of image charge values at a time along column bitlines 112 (illustrated) or may read out the image charge values using a variety of other techniques (not illustrated), such as a serial read out or a full parallel readout of all pixels 104 simultaneously.

In one example, control circuit 110 is coupled to pixel array 102 to control operational characteristics of pixel array 102. For instance, in one example, control circuit 110 generates transfer gate signals, reset signals, row select signals, etc., to control the acquisition and readout of image data from all of the pixels 104 of pixel array 102. In addition, control circuit 110 may generate a shutter signal for controlling image acquisition. In one example, the shutter signal is a global shutter signal for simultaneously enabling all pixels 104 within pixel array 102 to simultaneously capture their respective image charge values during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

Figure 2:
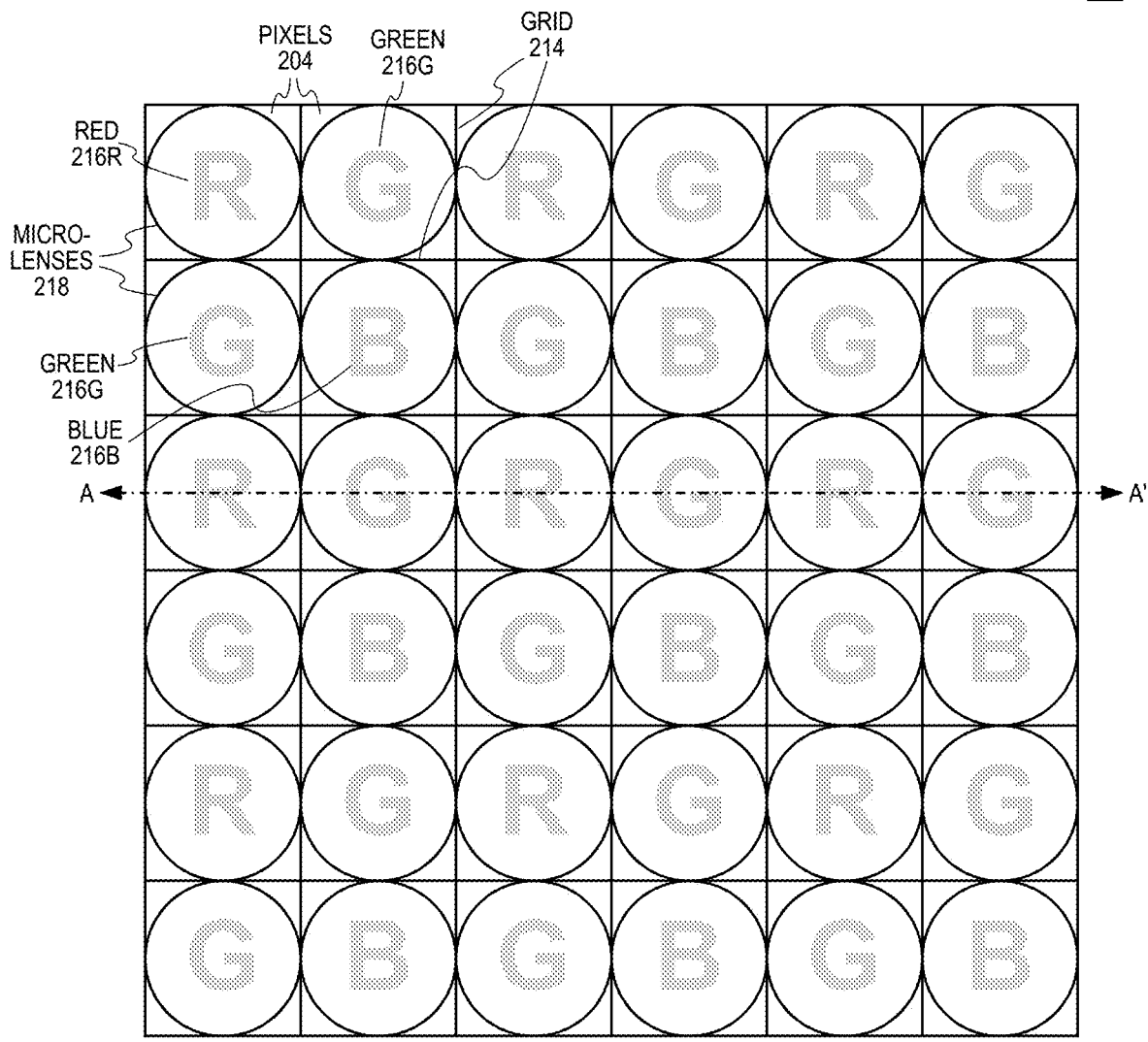
FIG. 2 illustrates a plan view of an example pixel array with a metal grid structure integrated with deep trench isolation structure in accordance with the teachings of the present invention.

FIG. 2 illustrates a plan view of an example pixel array 202 with a metal grid structure integrated with a deep trench isolation structure in accordance with the teachings of the present invention. It is appreciated the pixel array 202 of FIG. 2 may be one example of the pixel array 102 as shown in FIG. 1, and that similarly named and numbered elements described above are coupled and function similarly below.

As shown in the depicted example, pixel array 202 is a two-dimensional (2D) array including a plurality of pixels 204 that are arranged into rows and columns to acquire image data of a person, place, object, etc., which can then be used to render an image of a person, place, object, etc. In various examples, the pixels 204 are separated or isolated from one another with a grid structure 214 that is formed over a deep trench isolation (DTI) structure in the pixel array 202 in accordance with the teachings of the present invention.

The example shown in FIG. 2 also illustrates that pixel array 202 includes a color filter array that is disposed over the each of the pixels 204. In various embodiments, the color filter array includes color filters arranged according to a specific color pattern, such as a Bayer pattern, which in the depicted example is a mosaic of red 216R, blue 216B, and green 216B color filters (e.g., R, G, B) to transmit the respective light wavelength accordingly. The depicted example also illustrates that a plurality of microlenses 218 is disposed over each pixel 204 of the pixel array 202 for directing incident light onto each respect pixel 204. Thus, in the depicted example, each pixel 204 is optically coupled to receive incident light through a respective one of the plurality of microlenses and a respective one of the plurality of color filters (e.g., red 216R, green 216G, blue 216B) of the color filter array.

Figure 3A:
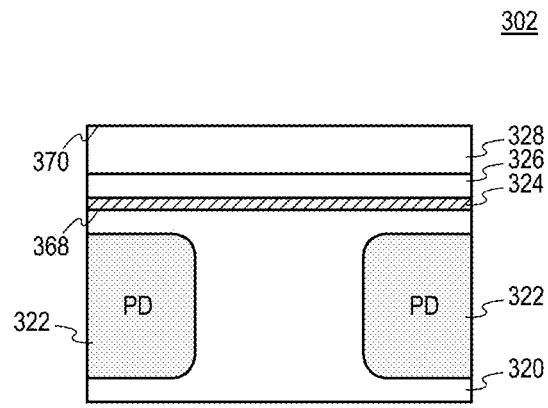
FIGS. 3A-3N illustrate cross-section views of various examples of a pixel array with a metal grid structure integrated with a deep trench isolation structure during various stages of fabrication in accordance with the teachings of the present invention.
Figure 3B:
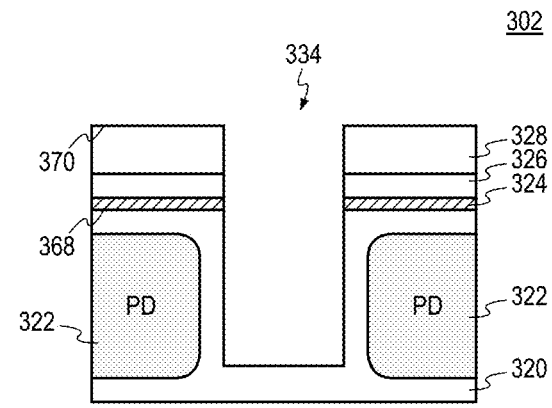
Figure 3C:
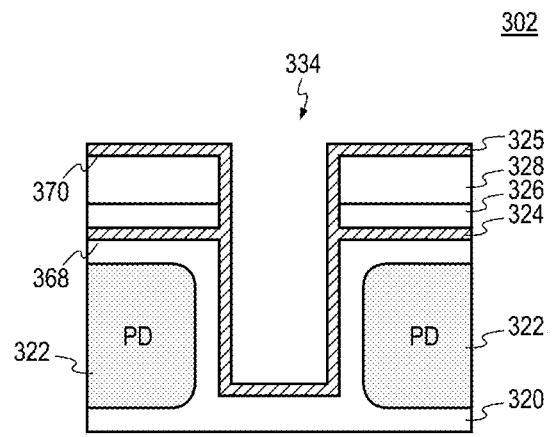
Figure 3D:
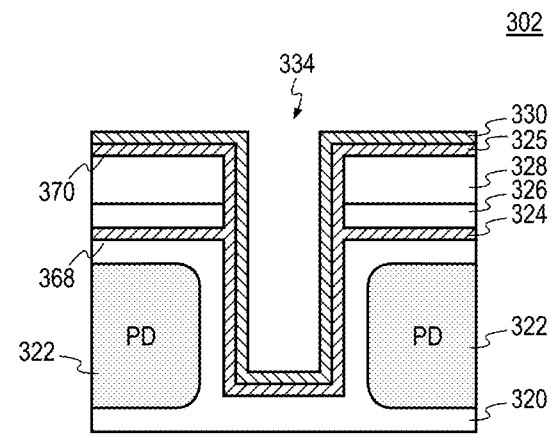
Figure 3E:
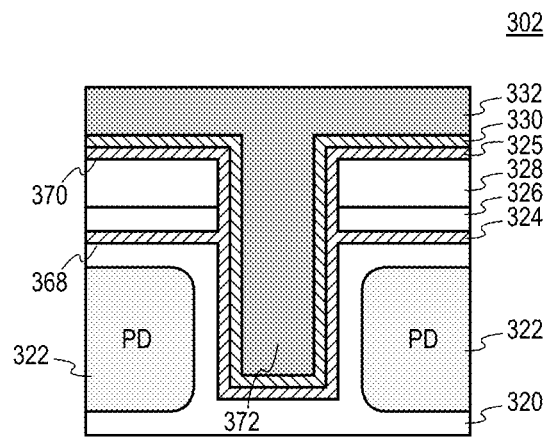
Figure 3F:
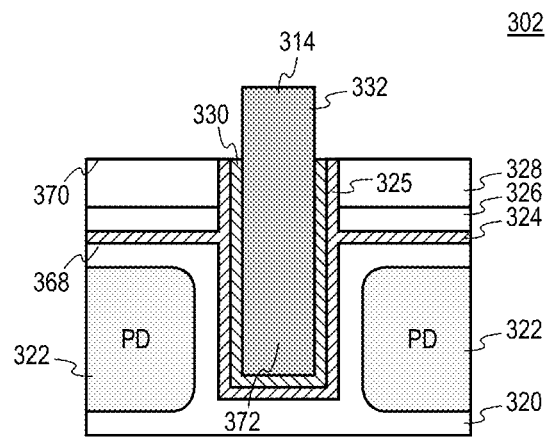
Figure 3G:
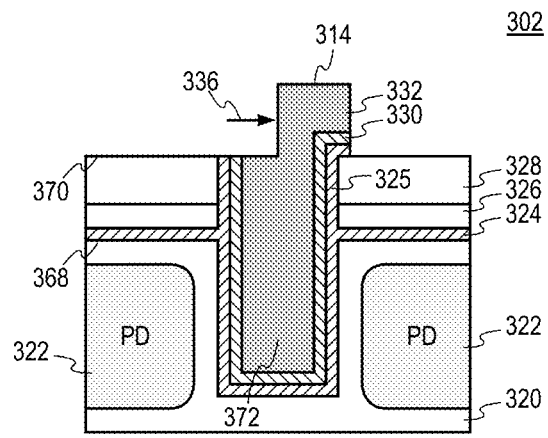
Figure 3H:
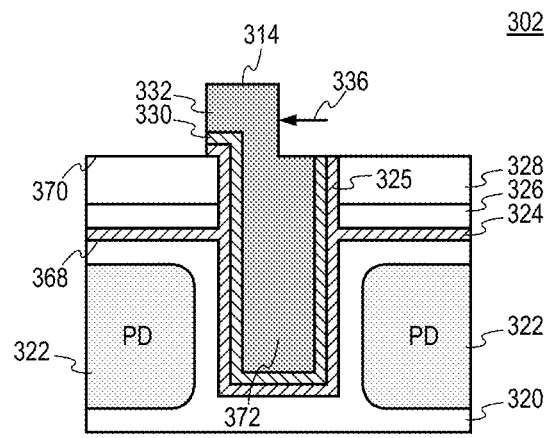
Figure 3I:
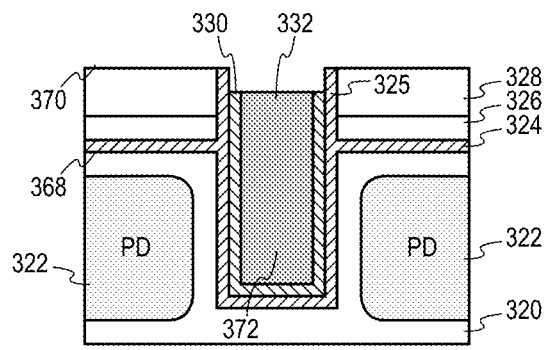
Figure 3J:
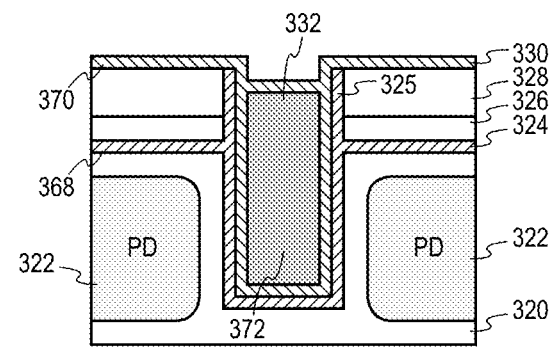
Figure 3K:
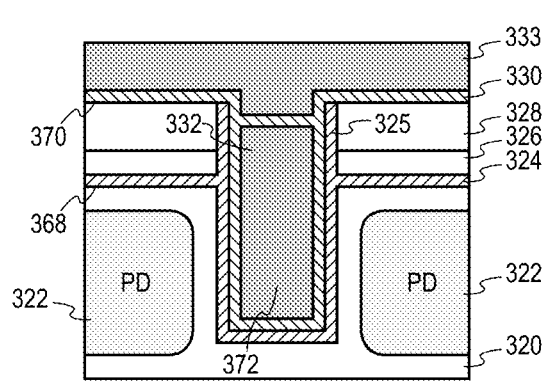
Figure 3L:
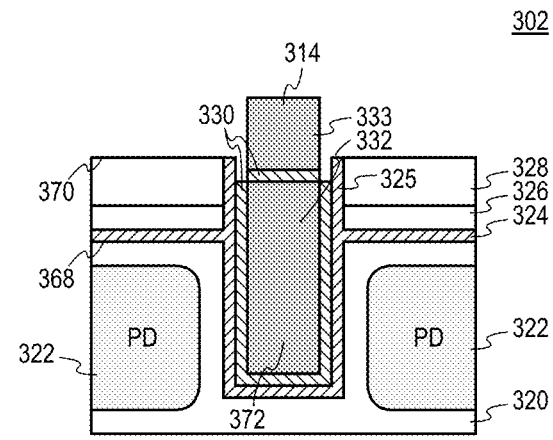
Figure 3M:
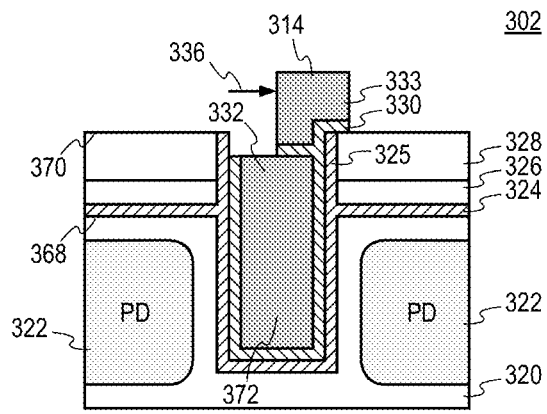
Figure 3N:
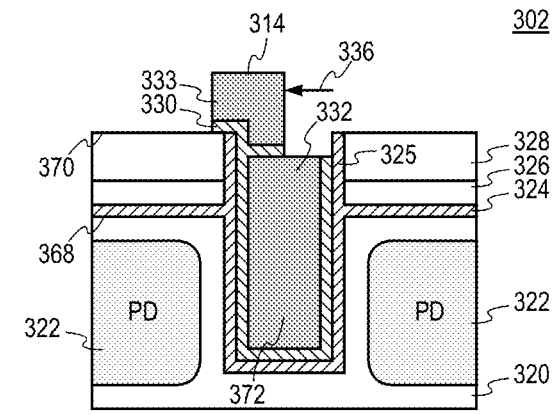

FIGS. 3A-3N illustrate cross-section views of various examples of a pixel array 302 with a metal grid structure integrated with a deep trench isolation structure during various stages of fabrication in accordance with the teachings of the present invention. It is appreciated that the various examples of pixel array 302 illustrated in FIGS. 3A-3N may be examples of pixel array 202 along dashed line A-A' as shown in FIG. 2, and/or of pixel array 102 as shown in FIG. 1, and that similarly named and numbered elements described above are coupled and function similarly below.

For instance, the example illustrated FIG. 3A shows a cross-section of a portion of pixel array 302, which may correspond to an example of pixel array 202 of FIG. 2 along dashed line A-A'. As shown in the depicted example, pixel array 302 includes a semiconductor substrate 320 in which an array of photodiodes 322 are formed. In the example illustrated in FIG. 3A, each photodiode 322 corresponds to a respective one of the pixels of pixel array 302. In one example, semiconductor substrate 320 may include silicon.

Continuing with the depicted example, a high k passivation layer 324 is disposed over semiconductor substrate 320. In one example, the high k passivation layer 324 is disposed over a backside surface 368 (or an illuminated surface) of semiconductor substrate 320. In various examples, the high k passivation layer 324 may include hafnium oxide (e.g., $HfO_2$), aluminum oxide (e.g., $Al_2O_3$), or a combination of both. In one embodiment, the high k passivation layer 324 include high dielectric material having a dielectric constant that is greater 3.9. In various examples, the high k passivation layer 324 is deposited with a thickness of approximately 3 to 9 nanometers.

As shown in the example, an anti-reflective coating layer 326 is disposed over the high k passivation layer 324. In various examples, anti-reflective coating layer 326 may include tantalum oxide (e.g., $Ta_2O_5$). In various examples, anti-reflective coating layer 326 is deposited with a thickness of approximately 50-80 nanometers.

Continuing with the example, a buffer layer 328 is disposed over the anti-reflective coating layer 326. In various examples, buffer layer 328 is an oxide layer including for example a silicon oxide material (e.g., $SiO_2$). In various examples, buffer layer 328 is deposited with a thickness of approximately 100 to 300 nanometers. In various examples, a chemical mechanical polishing process is applied to buffer layer 328 to planarize the buffer layer 328, which forms a plane or planar surface 370 on buffer layer 328 as shown.

The example depicted in FIG. 3B shows that a plurality of trenches 344 are etched into the semiconductor substrate 320 through the buffer layer 328, through the anti-reflective coating layer 326, through the high k passivation layer 324, and through the backside surface 368 of semiconductor substrate 320. In the various examples, it is appreciated that the plurality of trenches 334 are etched in a grid-like pattern in the semiconductor substrate 320 surrounding each of one of the photodiodes 322 of the array of photodiodes in the semiconductor substrate 320. In one example, the plurality of trenches 334 have a depth of approximately 1.5 to 2.5 micrometers in the semiconductor substrate 320 from the backside surface 368 of the semiconductor substrate 320. In one embodiment, the thickness of the semiconductor substrate 320 may range from 3 to 6 micrometers. It is appreciated that by etching the plurality of trenches 344 after the deposition of the high k passivation layer 324, the anti-reflective coating layer 326, and the buffer layer 328, the occurrence of choking issues at the top portion of the plurality of trenches 344 due to a later deposition of anti-reflective material can be avoided in accordance with the teachings of the present invention.

FIG. 3C shows that the interior of the plurality of trenches 344 is lined with an additional high k passivation layer 325 in the semiconductor substrate 320. Similar to the high k passivation layer 324 that is disposed over a backside surface 368 of semiconductor substrate 320, the additional high k passivation layer 325 that lines the interior of trench 344 may include hafnium oxide (e.g., $HfO_2$), aluminum oxide (e.g., $Al_2O_3$), or a combination of both. In various examples, the additional high k passivation layer 325 lining the interior of the trench 344 is deposited with a thickness of approximately 3 to 9 nanometers.

Continuing with the depicted example, FIG. 3D shows that an adhesive and barrier layer 330 is deposited over the additional high k passivation layer 325 that lines the interior of the plurality of trenches 344. In one example, the adhesive and barrier layer 330 includes titanium (e.g., Ti) for the adhesive material and titanium nitride (e.g., TiN) for the barrier material.

FIG. 3E shows that a plurality of deep trench isolation (DTI) structures 372 are formed with conductive material 332 that is blanket deposited over a plane 370 of the buffer layer 328 on the backside surface 368 of semiconductor substrate 320 and into the plurality of trenches 334 over the adhesive and barrier layer 330 to fill the plurality of trenches 334. In one example, the conductive material 332 that is used to fill the plurality of trenches 334 as shown includes tungsten (e.g., W).

FIGS. 3F-3H illustrate one example of processing steps that may occur during fabrication of pixel array 302 after the processing steps illustrated in FIGS. 3A-3E to form a grid structure 314 formed over the DTI structure 372 and above a plane 370 of the buffer layer 328. For instance, as shown in the example depicted in FIG. 3F, the conductive material 332 outside of the plurality of trenches 334 in which the DTI structure 372 is formed is patterned and etched to form grid structure 314.

In one example, it is noted that the patterning and etching that is performed to form grid structure 314 may include the patterning of a photoresist layer over the conductive material 332, and then etching the conductive material 332 and the adhesive and barrier layer 330 followed by the removal of the photoresist to form grid structure 314. In one example, the additional high k passivation layer 325 that is disposed above the plane 370 of the buffer layer 328 may also be removed during the etch of the conductive material 332 with the loss of some of the oxide material of the buffer layer 328 as well as some of the conductive material 332 (e.g., <20 nanometers) in DTI structure 372.

In one example, it is noted that the portion of example pixel array 302 shown in FIG. 3F illustrates a central region of the pixel array 302 as grid structure 314 is centered or aligned with the underlying DTI structure 372 between neighboring photodiodes 322 in semiconductor substrate 320. As such, the chief ray angle (e.g., CRA) of incident light in the central region of pixel array 302 is substantially perpendicular to the plane 370 of buffer layer 328 in the central region of pixel array 302.

In comparison, the portion of example pixel array 302 shown in FIG. 3G illustrates a region towards the left hand edge of the pixel array 302 as grid structure 314 is shifted 336 towards the center (e.g., towards the right in FIG. 3G) of pixel array 302 as shown. Since the portion of example pixel array 302 shown in FIG. 3G illustrates a region towards the left hand edge of the pixel array 302, the chief ray angle of incident light originates from above and towards the right of the plane 370 of buffer layer 328 shown in FIG. 3G. As such, the shift 336 towards the center of pixel array 302 accommodates the chief ray angle of the incident light in accordance with the teachings of the present invention. In the depicted example, it is noted that with the shift 336 towards the center of pixel array 302, a portion of the grid structure 314 is also disposed over a portion of the buffer layer 328 towards the center of the pixel array 302 as shown.

Similarly, the portion of example pixel array 302 shown in FIG. 3H illustrates a region towards the right hand edge of the pixel array 302 as grid structure 314 is shifted 336 towards the center (e.g., towards the left in FIG. 3H) of pixel array 302 as shown. Since the portion of example pixel array 302 shown in FIG. 3H illustrates a region towards the right hand edge of the pixel array 302, the chief ray angle of incident light originates from above and towards the left of the plane 370 of buffer layer 328 shown in FIG. 3H. As such, the shift 336 towards the center of pixel array 302 accommodates the chief ray angle of the incident light in accordance with the teachings of the present invention. In the depicted example, it is noted that with the shift 336 towards the center of pixel array 302, the portion of the grid structure 314 is also disposed over a portion of the buffer layer 328 towards the center of pixel array 302 as shown.

In various examples, it is appreciated that sulfur hexafluoride gas (e.g., $SF_6$) may be used to etch the conductive material 332 and chloride gas may be used to etch the adhesive and barrier layer 330. Sulfur hexafluoride gas has a high etching rate for tungsten. However, one of the considerations when using sulfur hexafluoride gas to etch the conductive material 332 is that the use of sulfur hexafluoride gas may result in over-etching of tungsten filler in the DTI structure 372, which could cause reliability issues, especially with a DTI structure 372 with a small trench critical dimension. Under-etching of the tungsten conductive material 332 could cause unwanted residue covering the backside surface 368 of semiconductor substrate 320 covering part of light exposure surface of underlying photodiode 322, detrimentally affecting the quantum efficiency (e.g., QE) of the respective photodiode 322.

FIGS. 3I-3N illustrate another example of processing steps that may occur during fabrication of pixel array 302 after the processing steps illustrated in FIGS. 3A-3E to form a grid structure 314 formed over the DTI structure 372 and above a plane 370 of the buffer layer 328. As will be shown in the example illustrated in FIGS. 3I-3N, the challenges presented when etching the conductive material 332 mentioned above are addressed by adding another adhesive and barrier layer 330 to act as an etch stop layer to provide improved etching control in accordance with the teachings of the present invention.

For instance, referring briefly back to the example shown in FIG. 3E, the plurality of deep trench isolation (DTI) structures 372 are formed with the conductive material 332 that is blanket deposited over the backside surface 368 of semiconductor substrate 320 and into the plurality of trenches 334 over the adhesive and barrier layer 330 to fill the plurality of trenches 334. In the example, the conductive material 332 that is used to fill the plurality of trenches 334 as shown includes tungsten (e.g., W).

Next, skipping now to the other example illustrated in FIGS. 3I-3N, the conductive material 332 over the backside surface 368 of semiconductor substrate 320 is then blanket etched to remove the conductive material 332 from outside of the plurality of trenches 334, which removes the conductive material 332 outside and above the DTI structure 372 as shown in FIG. 3I.

FIG. 3J shows that an additional adhesive and barrier layer 330 is then blanket deposited over the backside surface 368 of semiconductor substrate 320, including the conductive material 332 of DTI structure 372 in the plurality of trenches 334 and the buffer material 328 as shown. In the example, the adhesive and barrier layer 330 forms an etch stop layer over the planar surface 370 of buffer layer 330 and the conductive material 332 of DTI structure 372 in accordance with the teachings of the present invention.

FIG. 3K shows that with the additional adhesive and barrier layer 330 that is blanket deposited over the planar surface 370 of buffer layer 330 and the conductive material 332 of DTI structure 372 as shown, an additional or a second deposition of conductive material 333 is then blanket deposited over the additional adhesive and barrier layer 330. In one example, the second deposition of conductive material 333 that is blanket deposited over the additional adhesive and barrier layer 330 as shown includes tungsten (e.g., W).

FIG. 3L shows that with the second deposition of conductive material 333 that is blanket deposited over the additional adhesive and barrier layer 330, the grid structure 314 may then be formed by patterning and etching the second deposition of conductive material 333 formed over the additional adhesive and barrier layer 330 as shown.

In one example, it is noted that the patterning and etching that is performed to form grid structure 314 may include the patterning of a photoresist layer over the conductive material 333, and then etching the conductive material 333 with sulfur hexafluoride gas (e.g., $SF_6$), and then etching the adhesive and barrier layer 330 with chloride gas to form the grid structure 314 in accordance with the teachings of the present invention. It is appreciated that improved etching control is provided with the etch stop layer properties provided with the additional adhesive and barrier layer 330 deposited as shown in FIG. 3J in accordance with the teachings of the present invention.

In one example, it is noted that the portion of example pixel array 302 shown in FIG. 3L illustrates a central region of the pixel array 302 as grid structure 314 is centered or aligned with the underlying DTI structure 372 between neighboring photodiodes 322 in semiconductor substrate 320. As such, the chief ray angle (e.g., CRA) of incident light in the central region of pixel array 302 is substantially perpendicular to the plane 370 of buffer layer 328 in the central region of pixel array 302.

In comparison, the portion of example pixel array 302 shown in FIG. 3M illustrates a region towards the left hand edge of the pixel array 302 as grid structure 314 is shifted 336 towards the center (e.g., towards the right in FIG. 3M) of pixel array 302 as shown. Since the portion of example pixel array 302 shown in FIG. 3M illustrates a region towards the left hand edge of the pixel array 302, the chief ray angle of incident light originates from above and towards the right of the plane 370 of buffer layer 328 shown in FIG. 3M. As such, the shift 336 towards the center of pixel array 302 accommodates the chief ray angle of the incident light in accordance with the teachings of the present invention. In the depicted example, it is noted that with the shift 336 towards the center of pixel array 302, a portion of the grid structure 314 is also disposed over a portion of the buffer layer 328 towards the center of the pixel array 302 as shown.

Similarly, the portion of example pixel array 302 shown in FIG. 3N illustrates a region towards the right hand edge of the pixel array 302 as grid structure 314 is shifted 336 towards the center (e.g., towards the right in FIG. 3N) of pixel array 302 as shown. Since the portion of example pixel array 302 shown in FIG. 3N illustrates a region towards the right hand edge of the pixel array 302, the chief ray angle of incident light originates from above and towards the left of the plane 370 of buffer layer 328 shown in FIG. 3N. As such, the shift 336 towards the center of pixel array 302 accommodates the chief ray angle of the incident light in accordance with the teachings of the present invention. In the depicted example, it is noted that with the shift 336 towards the center of pixel array 302, the portion of the grid structure 314 is also disposed over a portion of the buffer layer 328 towards the center of pixel array 302 as shown.

Figure 4A:
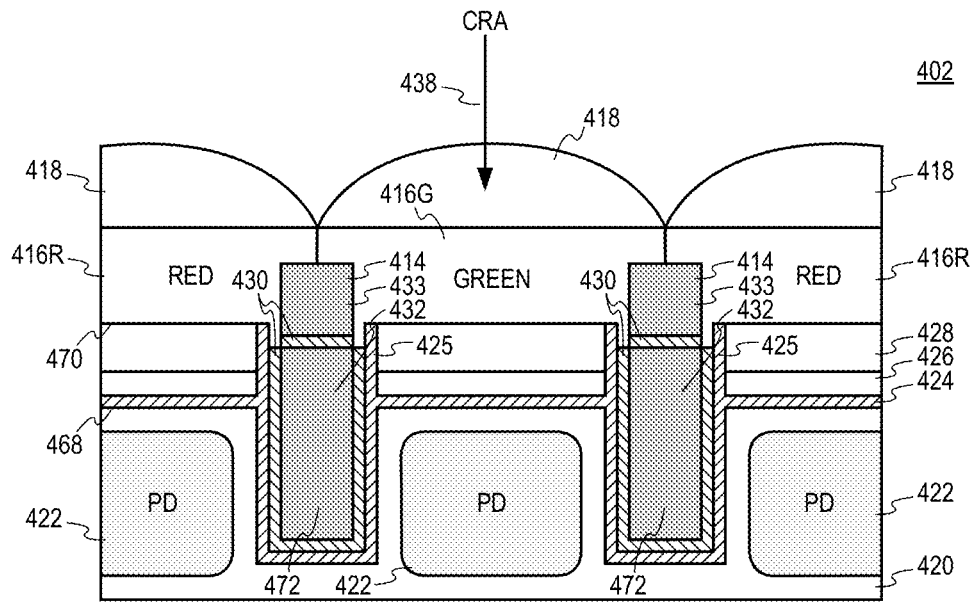
FIG. 4A illustrates a cross-section view of a center of an example pixel array with a metal grid structure integrated with a deep trench isolation structure in accordance with the teachings of the present invention.

FIG. 4A illustrates a cross-section view of a center of an example pixel array 402 with a metal grid structure integrated with a deep trench isolation structure in accordance with the teachings of the present invention. It is appreciated the example pixel array 402 shown in FIG. 4A may be another example of pixel array 302 shown in FIG. 3L, and/or an example of pixel array 202 along dashed line A-A' as shown in FIG. 2, and/or of pixel array 102 as shown in FIG. 1, and that similarly named and numbered elements described above are coupled and function similarly below.

As shown in the example depicted in FIG. 4A, pixel array 402 includes an array of photodiodes 422 formed in a semiconductor substrate 420. A high k passivation layer 424 is disposed over a backside surface 468 the semiconductor substrate 420. An anti-reflective coating layer 426 is disposed over the high k passivation layer 424, and a buffer layer 428 is disposed over the anti-reflective coating layer 426.

In the example, a DTI structure 472 is formed with conductive material (or a first deposition conductive material) 432 filling a plurality of trenches etched into the semiconductor substrate 420 through the buffer layer 428, through the anti-reflective coating layer 426, and through the high k passivation layer 424. In the example, the plurality of trenches in which the DTI structure 472 is formed are etched in a grid-like pattern in the semiconductor substrate 420 surrounding each of one of the photodiodes 422 of the array of photodiodes in the semiconductor substrate 420. DTI structure 472 provides electrical and optical isolation between photodiodes 422.

An additional high k passivation layer 425 is deposited to line the interior of the plurality of trenches in the semiconductor substrate 420 and an adhesive and barrier layer 430 is deposited over the additional high k passivation layer 425 that lines the interior of the plurality of trenches in which the DTI structure 472 is formed. As shown, the DTI structure 472 is formed with conductive material 432 deposited into the plurality of trenches over the adhesive and barrier layer 430 to fill the plurality of trenches. A grid structure 414 is formed over the DTI structure 472 and above a plane 470 of the buffer layer 428. In the example, the grid structure 418 is formed with a second deposition conductive material 433, which may include the same material used (e.g., W) in the conductive material 432 that forms the DTI structure 472.

As shown in the depicted example, pixel array 402 also includes a color filter array disposed over the plane 470 of buffer layer 428. In the example shown in FIG. 4A, the color filter array is an example of the color filter array shown in FIG. 2 along dashed line A-A'. As such, the color filter array shown in FIG. 4A includes red color filters 416R and green color filters 416G. As shown in the depicted example, each color filter 416R, 416G of the color filter array is optically aligned with a corresponding one of the photodiodes 422 of the array of photodiodes in the semiconductor substrate 420. In the example, each color filter 416R, 416G of the color filter array is disposed in a corresponding opening defined by the grid structure 414. In the example, the openings defined by the grid structure 414 form an aperture that is optically aligned to the light exposure region of underlying photodiodes 422. In the example, pixel array 402 also includes a microlens array disposed over the color filter array, with each microlens 418 of the microlens array optically aligned with a corresponding color filter 416R, 416G of the color filter array and a corresponding underlying photodiode 422 in the semiconductor substrate 420.

In the depicted example, it is noted that the portion of example pixel array 402 shown in FIG. 4A illustrates a central region of the pixel array 402 as grid structure 414 is centered or aligned with the underlying DTI structure 472 between neighboring photodiodes 422 in semiconductor substrate 420. As such, the chief ray angle (e.g., CRA) of incident light 438 in the central region of pixel array 402 is substantially perpendicular to the plane 470 of buffer layer 428 in the central region of pixel array 402.

Figure 4B:
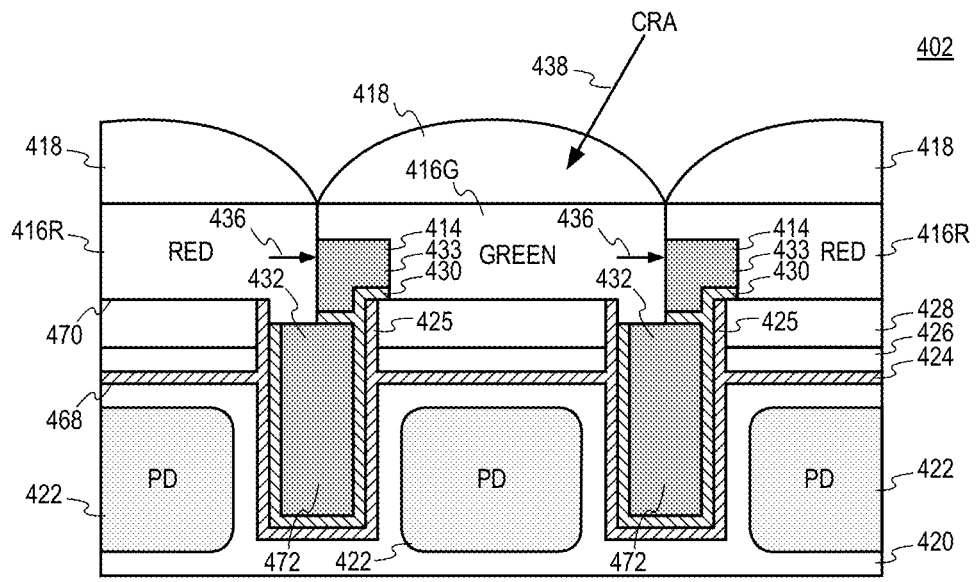
FIG. 4B illustrates a cross-section view of a left side of an example pixel array with a metal grid structure integrated with a deep trench isolation structure n accordance with the teachings of the present invention.

FIG. 4B illustrates a cross-section view of a left side of an example pixel array 402 with a metal grid structure integrated with a deep trench isolation structure in accordance with the teachings of the present invention. It is appreciated the example pixel array 402 shown in FIG. 4B may be another example of pixel array 302 shown in FIG. 3M, and/or an example of pixel array 202 along dashed line A-A' as shown in FIG. 2, and/or of pixel array 102 as shown in FIG. 1, and that similarly named and numbered elements described above are coupled and function similarly below.

It is further appreciated that the example pixel array 402 shown in FIG. 4B shares many similarities with the example pixel array 402 shown in FIG. 4A. For instance, the example depicted in FIG. 4B shows that pixel array 402 includes an array of photodiodes 422 formed in a semiconductor substrate 420. A high k passivation layer 424 is disposed over a backside surface 468 the semiconductor substrate 420. An anti-reflective coating layer 426 is disposed over the high k passivation layer 424, and a buffer layer 428 is disposed over the anti-reflective coating layer 426.

In the example, a DTI structure 472 is formed with conductive material 432 filling a plurality of trenches etched into the semiconductor substrate 420 through the buffer layer 428, through the anti-reflective coating layer 426, and through the high k passivation layer 424. In the example, the plurality of trenches in which the DTI structure 472 is formed are etched in a grid-like pattern in the semiconductor substrate 420 surrounding each of one of the photodiodes 422 of the array of photodiodes in the semiconductor substrate 420.

An additional high k passivation layer 425 is deposited to line the interior of the plurality of trenches in the semiconductor substrate 420 and an adhesive and barrier layer 430 is deposited over the additional high k passivation layer 425 forming a high k liner layer that lines the interior of the plurality of trenches in which the DTI structure 472 is formed. As shown, the DTI structure 472 is formed with conductive material 432 deposited into the plurality of trenches over the adhesive and barrier layer 430 to fill the plurality of trenches. A grid structure 414 is formed over the DTI structure 472 and above a plane 470 of the buffer layer 428. In the example, the grid structure 418 is formed with a second deposition conductive material 433, which may include the same material used (e.g., W) in the conductive material 432 that forms the DTI structure 472.

As shown in the depicted example, pixel array 402 also includes a color filter array including color filters (e.g., red color filter 416R, green color filter 416G) disposed over the plane 470 of buffer layer 428. As shown in the depicted example, each color filter 416R, 416G of the color filter array is optically aligned with a corresponding one of the photodiodes 422 of the array of photodiodes in the semiconductor substrate 420. In the example, each color filter 416R, 416G of the color filter array is disposed in a corresponding opening defined by the grid structure 414. In the example, pixel array 402 also includes a microlens array disposed over the color filter array, with each microlens 418 of the microlens array optically aligned with a corresponding color filter 416R, 416G of the color filter array and a corresponding underlying photodiode 422 in the semiconductor substrate 420.

In the depicted example, it is noted that the portion of example pixel array 402 shown in FIG. 4B illustrates a region towards the left hand edge of the pixel array 402 as grid structure 414 is shifted 436 towards the center (e.g., towards the right in FIG. 4B) of pixel array 402 as shown. Since the portion of example pixel array 402 shown in FIG. 4B illustrates a region towards the left hand edge of the pixel array 402, the chief ray angle of incident light 438 originates from above and towards the right of the plane 470 of buffer layer 428 shown in FIG. 4B. As such, the shift 436 towards the center of pixel array 402 accommodates the chief ray angle of the incident light 438 in accordance with the teachings of the present invention. In the depicted example, it is noted that with the shift 436 towards the center of pixel array 402, a portion of the grid structure 414 is also disposed over a portion of the buffer layer 428 towards the center of the pixel array 402 as shown.

Figure 4C:
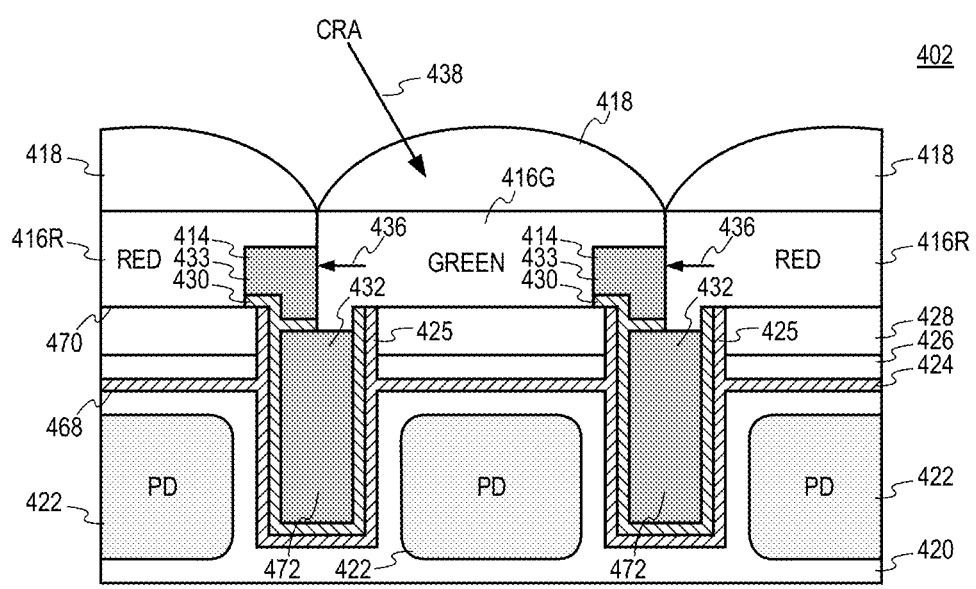
FIG. 4C illustrates a cross-section view of a right side of an example pixel array with a metal grid structure integrated with a deep trench isolation structure in accordance with the teachings of the present invention.

FIG. 4C illustrates a cross-section view of a right side of an example pixel array 402 with a metal grid structure integrated with a deep trench isolation structure in accordance with the teachings of the present invention. It is appreciated the example pixel array 402 shown in FIG. 4C may be another example of pixel array 302 shown in FIG. 3N, and/or an example of pixel array 202 along dashed line A-A' as shown in FIG. 2, and/or of pixel array 102 as shown in FIG. 1, and that similarly named and numbered elements described above are coupled and function similarly below.

It is further appreciated that the example pixel array 402 shown in FIG. 4C shares many similarities with the examples of pixel array 402 shown in FIGS. 4A-4B. For instance, the example depicted in FIG. 4C shows that pixel array 402 includes an array of photodiodes 422 formed in a semiconductor substrate 420. A high k passivation layer 424 is disposed over a backside surface 468 the semiconductor substrate 420. An anti-reflective coating layer 426 is disposed over the high k passivation layer 424, and a buffer layer 428 is disposed over the anti-reflective coating layer 426.

In the example, a DTI structure 472 is formed with conductive material 432 filling a plurality of trenches etched into the semiconductor substrate 420 through the buffer layer 428, through the anti-reflective coating layer 426, and through the high k passivation layer 424. In the example, the plurality of trenches in which the DTI structure 472 is formed are etched in a grid-like pattern in the semiconductor substrate 420 surrounding each of one of the photodiodes 422 of the array of photodiodes in the semiconductor substrate 420.

An additional high k passivation layer 425 is deposited to line the interior of the plurality of trenches in the semiconductor substrate 420 and an adhesive and barrier layer 430 is deposited over the additional high k passivation layer 425 that lines the interior of the plurality of trenches in which the DTI structure 472 is formed. As shown, the DTI structure 472 is formed with conductive material 432 deposited into the plurality of trenches over the adhesive and barrier layer 430 to fill the plurality of trenches. A grid structure 414 is formed over the DTI structure 472 and above a plane 470 of the buffer layer 428. In the example, the grid structure 418 is formed with a second deposition conductive material 433, which may include the same material used (e.g., W) in the conductive material 432 that forms the DTI structure 472.

As shown in the depicted example, pixel array 402 also includes a color filter array including color filters (e.g., red color filter 416R, green color filter 416G) disposed over the plane 470 of buffer layer 428. As shown in the depicted example, each color filter 416R, 416G of the color filter array is optically aligned with a corresponding one of the photodiodes 422 of the array of photodiodes in the semiconductor substrate 420. In the example, each color filter 416R, 416G of the color filter array is disposed in a corresponding opening defined by the grid structure 414. In the example, pixel array 402 also includes a microlens array disposed over the color filter array, with each microlens 418 of the microlens array optically aligned with a corresponding color filter 416R, 416G of the color filter array and a corresponding underlying photodiode 422 in the semiconductor substrate 420.

In the depicted example, it is noted that the portion of example pixel array 402 shown in FIG. 4C illustrates a region towards the right hand edge of the pixel array 402 as grid structure 414 is shifted 436 towards the center (e.g., towards the left in FIG. 4C) of pixel array 402 as shown. Since the portion of example pixel array 402 shown in FIG. 4C illustrates a region towards the right hand edge of the pixel array 402, the chief ray angle of incident light 438 originates from above and towards the left of the plane 470 of buffer layer 428 shown in FIG. 4C. As such, the shift 436 towards the center of pixel array 402 accommodates the chief ray angle of the incident light 438 in accordance with the teachings of the present invention. In the depicted example, it is noted that with the shift 436 towards the center of pixel array 402, a portion of the grid structure 414 is also disposed over a portion of the buffer layer 428 towards the center of the pixel array 402 as shown.

Figure 5:
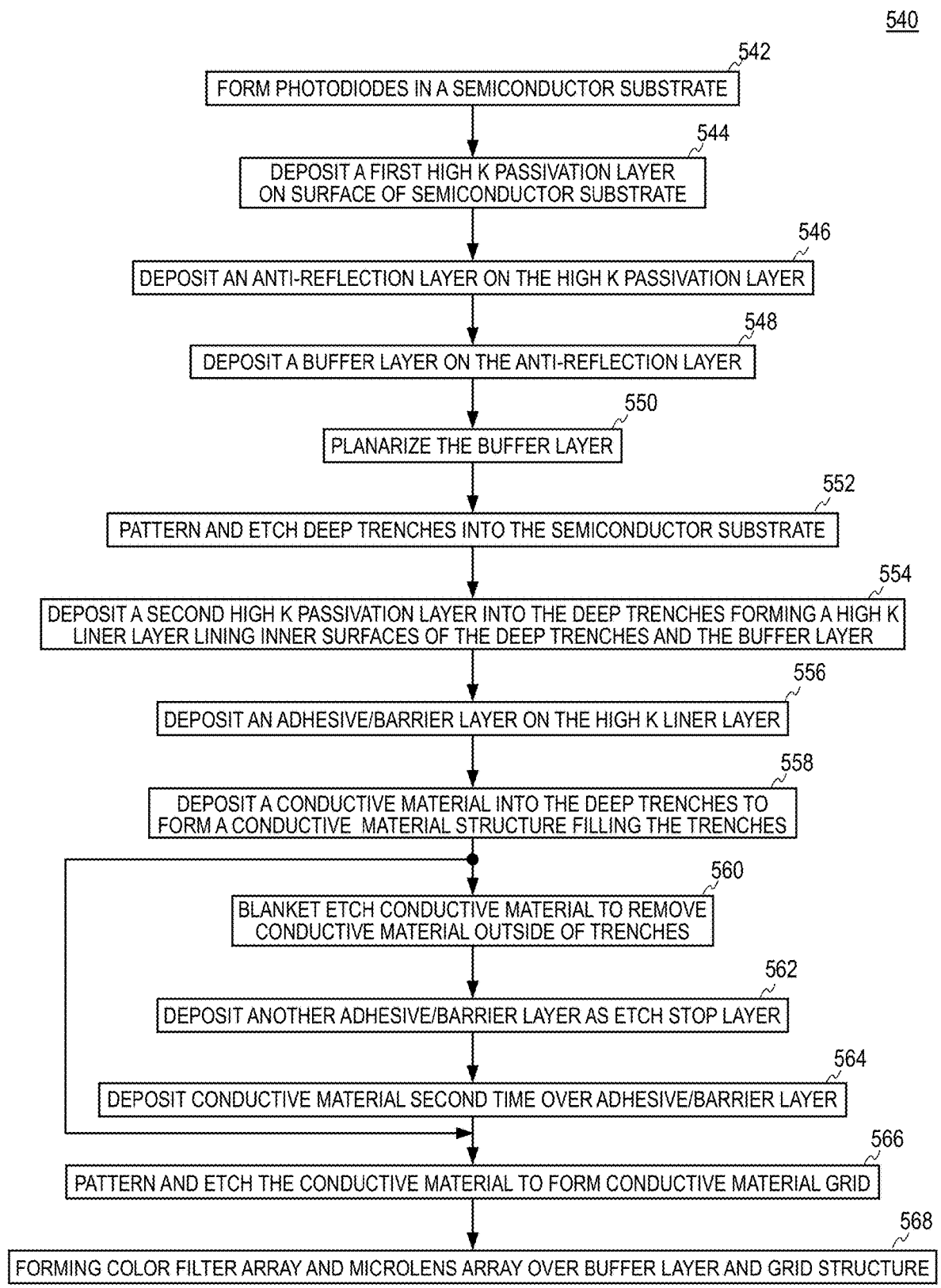
FIG. 5 is a flow diagram illustrating an example process to fabricate a pixel array with a metal grid structure integrated with a deep trench isolation structure in accordance with the teachings of the present invention.

FIG. 5 is a flow diagram illustrating an example process 540 to fabricate a pixel array with a metal grid structure integrated with a deep trench isolation structure in accordance with the teachings of the present invention. It is appreciated that an example pixel array fabricated with process 540 may be an example of the pixel arrays 402 as shown in FIGS. 4A-4C, and/or an example of the pixel arrays 302 as shown in FIGS. 3A-3N, and/or an example of pixel array 202 as shown in FIG. 2, and/or of pixel array 102 as shown in FIG. 1, and that similarly named and numbered elements described above are coupled and function similarly below As shown in process 540 of FIG. 5, processing begins at process block 542 where an array of photodiodes are formed in a semiconductor substrate. In one example, the semiconductor substrate provided in process block 542 may be a semi-fabricated substrate after a front-end of line process (e.g., formation of pixel circuitry including photodiodes, floating diffusions, transistors, and metal interconnection structures, etc.).

Process block 544 shows that a first high k passivation layer is then deposited on a surface of semiconductor substrate. In one example, the first high k passivation layer may be for example hafnium oxide, aluminum oxide, or a combination of both. In one example, the first high k passivation layer is deposited on a backside surface of the semiconductor substrate at a thickness of for example 3 to 9 nanometers.

Process block 546 shows that an anti-reflective coating layer is then deposited on the first high k passivation layer. In one example, the anti-reflective coating layer may include tantalum oxide. In one example, the anti-reflective coating layer is deposited to a thickness of for example 50-80 nanometers.

Process block 548 shows that a buffer layer is then deposited on the anti-reflective coating layer. In one example, the buffer layer may include a silicon oxide material. In one example, the buffer layer is deposited on the anti-reflective coating layer to a thickness of for example 100 to 300 nanometers.

Process block 550 shows that the buffer layer is then planarized. In one example, the planarization of the buffer layer is performed with a chemical mechanical polishing (CMP) process.

Process block 552 shows that deep trenches are then patterned and etched into the semiconductor substrate. In one example, the patterning and etching of the trenches into the semiconductor substrate may be performed by depositing photoresist on the buffer layer. The photoresist may be patterned by a lithography process. In the various examples, the etching of the deep trenches is then performed through the stack of the first high k passivation layer, the anti-reflective coating layer, and the buffer layer a depth into the semiconductor substrate. In the various examples, the buffer layer provides protection during etch process to the underlying layers.

Process block 554 shows that a second high k passivation layer is then deposited into the etched deep trenches forming a high k liner layer lining inner surfaces of the deep trenches and the buffer layer.

Process block 556 shows that an adhesive and barrier layer (first adhesive and barrier layer) is deposited on the high k liner layer that is deposited into the deep trenches.

Process block 558 shows that a conductive material is deposited into the deep trenches to form a conductive material structure filling the trenches. In one example, the conductive material structure filling the trenches forms a deep trench isolation structure. In one example, the conductive material includes tungsten.

In one example, processing after block 558 may jump to process block 566 as shown in FIG. 5. In this example, the processing that occurs in process block 566 corresponds to the processing shown in FIGS. 3F-3H above where the conductive material is patterned and etched to form a grid structure formed with the conductive material.

In another example, processing after block 558 may proceed to process blocks 560, 562, and 564 as shown in FIG. 5. In this example, the processing that occurs in process blocks 560, 562, and 564 corresponds to the processing shown in FIGS. 3I-3K.

For instance, process block 560 shows that the conductive material is blanket etched to remove the excess conductive material outside of trenches. In one example, the high k liner layer material and the adhesive and barrier layer (first adhesive and barrier layer) outside of the trenches are also removed during process block 560.

Process block 562 shows that another adhesive and barrier layer (second adhesive and barrier layer) is then blanket deposited as etch stop layer.

Process block 564 shows that conductive material is then deposited a second time over the second deposited adhesive and barrier layer that was blanket deposited as etch stop layer.

In this example, processing after process block 564 then proceeds to process block 566, which in this example corresponds to the processing shown in FIGS. 3L-3N where the second time deposited conductive material is patterned and etched to form a grid structure formed with the conductive material.

Process block 568 shows that a color filter array and a microlens array are then formed over the buffer layer and the grid structure. In one example, process block 568 includes depositing the color filter array over the buffer layer such that each color filter of the color filter array is optically aligned with a corresponding one of the photodiodes of the array of photodiodes in the semiconductor substrate. In one example, each color filter of the color filter array is disposed in a corresponding opening defined by the grid structure. In the example, process block 568 also includes disposing the microlens array over the color filter array and the grid structure such that each microlens of the microlens array is optically aligned with a corresponding color filter of the color filter array.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel array, comprising:
   an array of photodiodes formed in a semiconductor substrate;
   a first high k passivation layer disposed over the semiconductor substrate;
   an anti-reflective coating layer disposed over the first high k passivation layer;
   a buffer layer disposed over the anti-reflective coating layer;
   a plurality of trenches etched into the semiconductor substrate through the buffer layer, through the anti-reflective coating layer, and through the first high k passivation layer, wherein the plurality of trenches are etched in a grid-like pattern in the semiconductor substrate surrounding each of one of the photodiodes of the array of photodiodes in the semiconductor substrate;
   a second high k passivation layer lining an interior of the plurality of trenches in the semiconductor substrate;
   an adhesive and barrier layer deposited over the second high k passivation layer lining the interior of the plurality of trenches;

a deep trench isolation (DTI) structure formed with conductive material deposited into the plurality of trenches over the adhesive and barrier layer to fill the plurality of trenches; and a grid structure formed over the DTI structure and above a plane of the buffer layer, wherein the grid structure is formed with the conductive material.

2. The pixel array of claim 1, further comprising a color filter array disposed over the buffer layer, wherein each color filter of the color filter array is optically aligned with a corresponding one of the photodiodes of the array of photodiodes in the semiconductor substrate, wherein each color filter of the color filter array is disposed in a corresponding opening defined by the grid structure.

3. The pixel array of claim 2, further comprising a microlens array disposed over the color filter array, wherein each microlens of the microlens array is optically aligned with a corresponding color filter of the color filter array.

4. The pixel array of claim 1, wherein the grid structure at edges of the pixel array is shifted towards a center of the pixel array.

5. The pixel array of claim 4, wherein a portion of the grid structure at the edges of the pixel array that is shifted towards a center of the pixel array is further disposed over a portion of the buffer layer.

6. The pixel array of claim 1, further comprising the adhesive and barrier layer deposited between the grid structure and the DTI structure.

7. The pixel array of claim 1, wherein the semiconductor substrate comprises silicon.

8. The pixel array of claim 1, wherein the conductive material comprises tungsten.

9. The pixel array of claim 1, wherein the first high k passivation layer and the second high k passivation layer comprise one or more of hafnium oxide and aluminum oxide.

10. The pixel array of claim 1, wherein each of the first high k passivation layer and the second high k passivation layer has a thicknesses of approximately 3 to 9 nanometers.

11. The pixel array of claim 1, wherein the anti-reflective coating layer comprises tantalum oxide.

12. The pixel array of claim 1, wherein the anti-reflective coating layer has a thickness of approximately 50-80 nanometers.

13. The pixel array of claim 1, wherein the buffer layer comprises silicon oxide.

14. The pixel array of claim 1, wherein the buffer layer has a thickness of approximately 100 to 300 nanometers.

15. The pixel array of claim 1, wherein the adhesive and barrier layer comprises titanium and titanium nitride.

16. The pixel array of claim 1, wherein the plurality of trenches have a depth of approximately 1.5 to 2.5 micrometers in the semiconductor substrate from a backside surface of the semiconductor substrate.

17. A method for fabricating a pixel array, comprising:
forming an array of photodiodes in a semiconductor substrate;
depositing a first high k passivation layer over the semiconductor substrate;
depositing an anti-reflective coating layer over the first high k passivation layer;
depositing a buffer layer over the anti-reflective coating layer;
etching a plurality of trenches into the semiconductor substrate through the buffer layer, through the anti-reflective coating layer, and through the first high k passivation layer;

lining an interior of the plurality of trenches in the semiconductor substrate with a second high k passivation layer;
depositing an adhesive and barrier layer over the second high k passivation layer lining the interior of the plurality of trenches;
filling the plurality of trenches with a conductive material deposited into the plurality of trenches over the adhesive and barrier layer to form a deep trench isolation (DTI) structure comprising the conductive material; and
forming a grid structure over the DTI structure and above a plane of the buffer layer, wherein the grid structure is formed with the conductive material.

18. The method of claim 17, further comprising planarizing the buffer layer after depositing the buffer layer and prior to etching the plurality of trenches into the semiconductor substrate.

19. The method of claim 17, wherein said etching the plurality of trenches into the semiconductor substrate comprises etching the plurality of trenches in a grid-like pattern in the semiconductor substrate surrounding each of one of the photodiodes of the array of photodiodes in the semiconductor substrate.

20. The method of claim 17, wherein said forming the grid structure over the DTI structure and over the plane of the buffer layer comprises patterning and etching the conductive material outside of the plurality of trenches to form the grid structure.

21. The method of claim 17, further comprising:
blanket etching a first deposition of the conductive material outside of the plurality of trenches to remove the first deposition of the conductive material outside the plurality of trenches after said filling the plurality of trenches with the conductive material deposited into the plurality of trenches over the adhesive and barrier layer;
depositing a second adhesive and barrier layer over the conductive material deposited into the plurality of trenches and the buffer layer to form an etch stop layer; and
depositing a second deposition of the conductive material over the second adhesive and barrier layer,
wherein said forming the grid structure over the DTI structure and over a plane of the buffer layer comprises patterning and etching the second deposition of the conductive material deposited over the second adhesive and barrier layer to form the grid structure over the DTI structure and over a plane of the buffer layer.

22. The method of claim 17, further comprising depositing a color filter array over the buffer layer, wherein each color filter of the color filter array is optically aligned with a corresponding one of the photodiodes of the array of photodiodes in the semiconductor substrate, wherein each color filter of the color filter array is disposed in a corresponding opening defined by the grid structure.

23. The method of claim 22, further comprising disposing a microlens array over the color filter array, wherein each microlens of the microlens array is optically aligned with a corresponding color filter of the color filter array.

24. The method of claim 17, further comprising shifting the grid structure at edges of the pixel array towards a center of the pixel array.

25. The method of claim 24, wherein a portion of the grid structure at the edges of the pixel array that is shifted towards a center of the pixel array is further disposed over a portion of the buffer layer.

26. The method of claim 17, wherein the semiconductor substrate comprises silicon.

27. The method of claim 17, wherein the conductive material comprises tungsten.

28. The method of claim 17, wherein the first high k passivation layer and the second high k passivation layer comprise one or more of hafnium oxide and aluminum oxide.

29. The method of claim 17, wherein the anti-reflective coating layer comprises tantalum oxide.

30. The method of claim 17, wherein the buffer layer comprises silicon oxide.

31. The method of claim 17, wherein the adhesive and barrier layer comprises titanium and titanium nitride.

* * * * *